United States Patent
Jung (10) Patent No.: US 7,709,321 B2
(45) Date of Patent: May 4, 2010

(54) FLASH MEMORY DEVICE AND FABRICATING METHOD THEREOF

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 819 days.

(21) Appl. No.: 11/024,700

(22) Filed: Dec. 30, 2004

(65) Prior Publication Data

US 2005/0142749 A1    Jun. 30, 2005

(30) Foreign Application Priority Data

Dec. 31, 2003    (KR) .................. 10-2003-0101069

(51) Int. Cl.
*H01L 21/336* (2006.01)

(52) U.S. Cl. ............... 438/257; 438/238; 438/381; 438/700; 438/954; 257/E21.68; 257/E21.545; 257/E21.645; 257/E21.655

(58) Field of Classification Search ............... 438/257, 438/238, 381, 445, 446, 267, 270, 439, 954, 438/692, 700, 637

See application file for complete search history.

(56) References Cited

U.S. PATENT DOCUMENTS

| | | | |
|---|---|---|---|
| 5,427,970 A | 6/1995 | Hsue et al. | |
| 5,585,656 A | 12/1996 | Hsue et al. | |
| 5,677,216 A | 10/1997 | Tseng | |
| 6,117,731 A * | 9/2000 | Wu | 438/260 |
| 6,259,130 B1 * | 7/2001 | Wu | 257/314 |
| 6,297,097 B1 | 10/2001 | Jeong | |
| 6,323,516 B1 | 11/2001 | Wang et al. | |
| 6,559,008 B2 * | 5/2003 | Rabkin et al. | 438/257 |
| 6,596,589 B2 * | 7/2003 | Tseng | 438/260 |
| 2004/0152260 A1 * | 8/2004 | Rabkin et al. | 438/257 |

* cited by examiner

*Primary Examiner*—David Nhu
(74) *Attorney, Agent, or Firm*—Lowe Hauptman Ham & Berner LLP (57) ABSTRACT

A flash memory and a flash memory fabrication method for increasing the coupling ratio by HSG including forming a STI region on a silicon substrate to define an active region, forming a tunneling oxide layer on the active region, and depositing an amorphous silicon layer on the silicon substrate. The method also includes patterning the amorphous silicon layer along a bit line direction, forming an embossed silicon layer including HSGs on the patterned amorphous silicon layer, and sequentially depositing an ONO layer and a polysilicon layer for a control gate on the resulting structure. The method further includes forming a photoresist pattern on the polysilicon layer, and forming a control gate by etching the polysilicon layer using the photoresist pattern as a mask, and simultaneously forming a floating gate along the bit line.

4 Claims, 7 Drawing Sheets

FLASH MEMORY DEVICE AND FABRICATING METHOD THEREOF

BACKGROUND OF THE INVENTION

1. Field of the Invention

The present invention generally relates to a semiconductor device and a fabrication method thereof and, more particularly, to a method of fabricating a gate flash memory for increasing a coupling ratio between a floating gate and a control gate.

2. Background of the Related Art

A flash memory generally includes a floating gate and a control gate. A dielectric layer such as oxide-nitride-oxide (hereinafter referred to as "ONO") is positioned between the floating gate and the control gate and a tunneling oxide is positioned between the control gate and a silicon substrate. Such a flash memory usually stores or removes data in the way that electrons or holes are held in or removed from the floating gate. In other words, because the floating gate is completely isolated by the tunneling oxide and the dielectric layer, once electrons or holes enter the floating gate, they cannot escape from the floating gate even if no power is supplied. Therefore, data can be stored in the flash memory.

In order to write or erase data in the flash memory, a bias applied to terminals accessible from outside, that is, the control gate and a junction or a substrate, has to be induced to the floating gate to generate a strong electric field at both ends of the tunneling oxide. A coupling ratio (hereinafter referred to as "CR") is a ratio of the voltage applied to the control gate and the junction or the substrate and the voltage induced to the floating gate. As the coupling ratio, CR, increases, the efficiency of programming and erase operations in a memory cell improves and the voltage required from outside decreases.

The CR is defined as a ratio between tunneling oxide capacitance and ONO capacitance. When the tunneling oxide capacitance is represented as $C_{TUN}$ and the ONO capacitance is represented as $C_{ONO}$, the coupling ratio CR is expressed as follows:

$$CR = C_{ONO}/(C_{TUN} + C_{ONO})$$

For a high CR, the $C_{ONO}$ has to be relatively high compared to the $C_{TUN}$. The capacitance is determined by several factors such as a dielectric constant, the thickness of a dielectric layer, and the area of a capacitor.

In a general flash memory fabrication process, the thickness of the tunneling oxide is about 80 Å through 120 Å and the thickness of the dielectric layer is about 150 Å through 300 Å. For same area of the $C_{ONO}$ and the $C_{TUN}$, the $C_{ONO}$ becomes smaller than the $C_{TUN}$ and, therefore, it is difficult to obtain a CR required for adequate operation of the flash memory. Accordingly, in order to ensure a high CR, methods for increasing the surface area of the floating gate have been suggested.

FIGS. 1a through 1g are cross-sectional views illustrating a related art flash memory fabricating process for increasing the surface area of the floating gate.

Figure 1A:
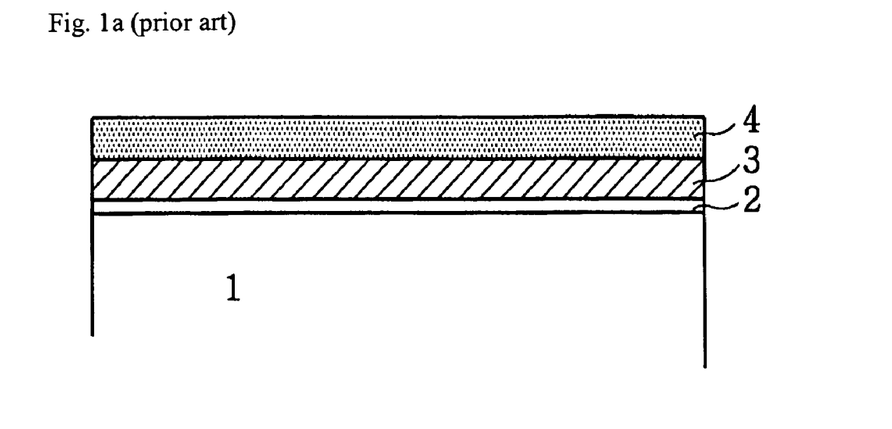
FIGS. 1a through 1g are cross-sectional views illustrating a related art flash memory fabricating process to increase the surface area of the floating gate.

Referring to FIG. 1a, a tunneling oxide layer 2 is deposited on a substrate 1. A first polysilicon layer 3 used to form a floating gate is then deposited on the tunneling oxide 2. Then, a first mask layer 4 is deposited on the first polysilicon layer 3. The first mask layer 4 is generally nitride.

Figure 1B:
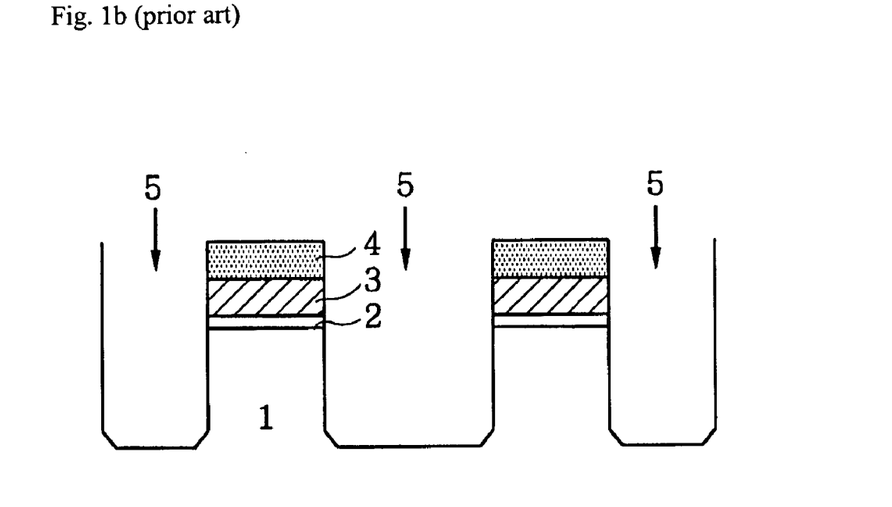

Referring to FIG. 1b, some parts of the first mask layer 4, the first polysilicon layer 3, the tunneling oxide 2, and the silicon substrate 1 within a field oxide area 5 to be formed in a subsequent process are removed by a photolithography process and an etching process to form shallow trench isolation (hereinafter referred to as "STI").

Figure 1C:
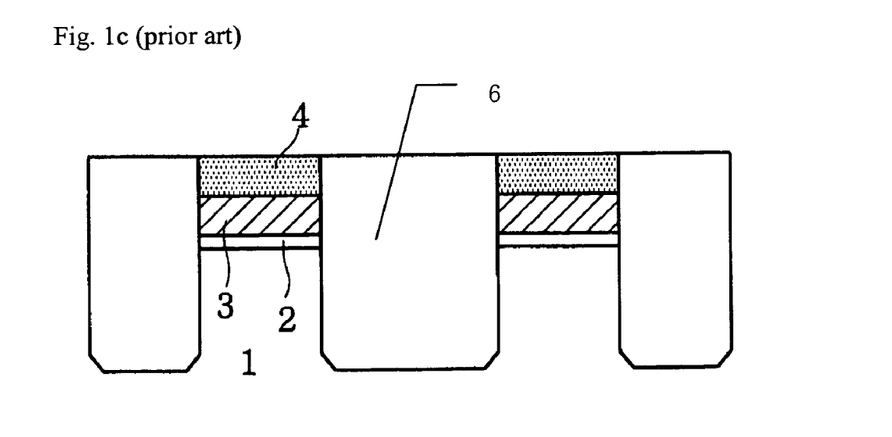

Referring to FIG. 1c, a field oxide 6 is deposited on the first mask layer 4 and the STI and a chemical mechanical polishing (hereinafter referred to as "CMP") process is then performed so that the field oxide 6 remains only within the STI.

Figure 1D:
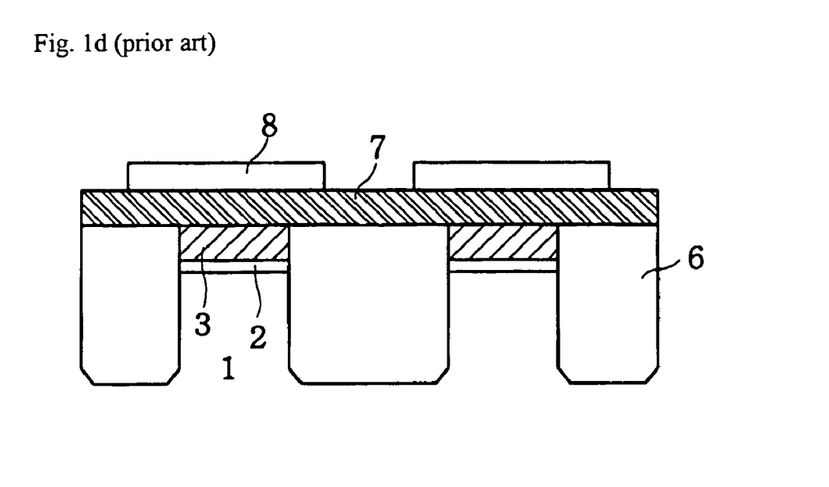

Referring to FIG. 1d, the STI field oxide 6 is etched until its height reaches the height of the floating gate 3, and then the first mask layer 4 is removed. Then, a second polysilicon layer 7 used to form a second floating gate is deposited over the whole surface of the resulting substrate including the first floating gate 3. A second mask layer is deposited on the second polysilicon layer 7 and selectively etched to form a second mask pattern 8.

Figure 1E:
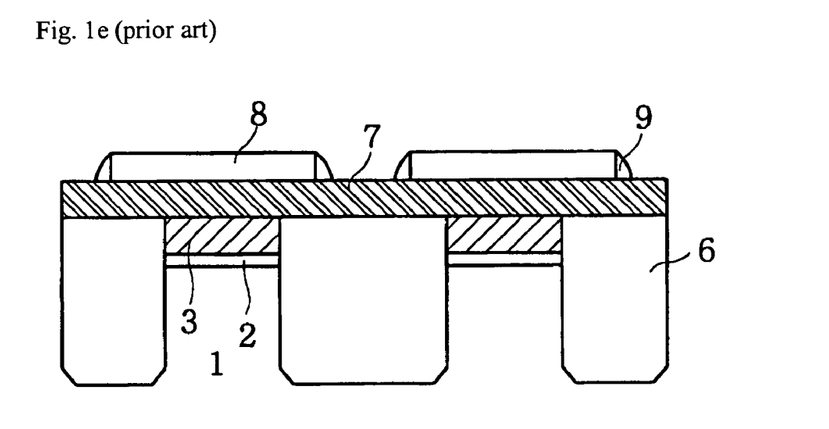

Referring to FIG. 1e, a third mask material layer is deposited on the second polysilicon layer 7 and the second mask pattern 8, and anisotropically etched to form spacers 9 on the sidewalls of the second mask pattern 8.

Figure 1F:
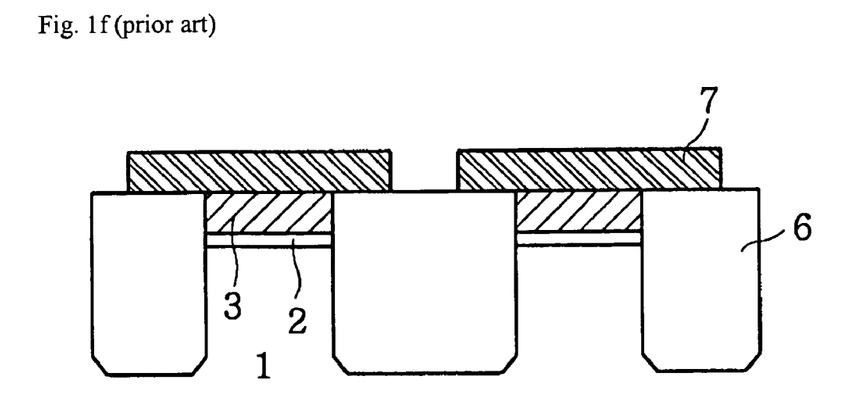

Referring to FIG. 1f, the second polysilicon layer 7 is etched using the second mask pattern 8 and the spacers 9 as a hard mask to form the second floating gate 7. Then, the second mask pattern 8 and the spacers 9 are respectively removed.

Figure 1G:
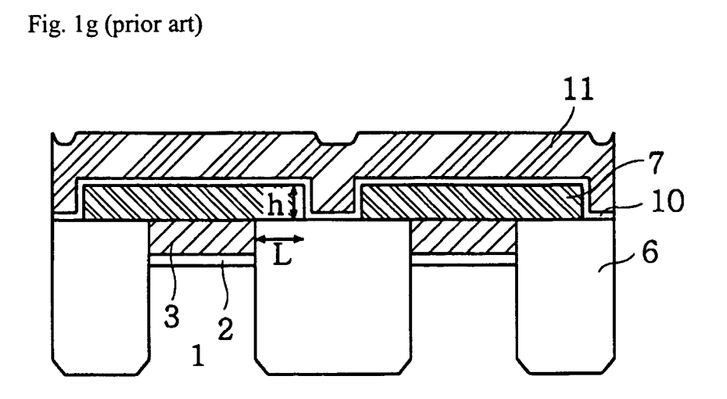

Finally, referring to FIG. 1g, a dielectric layer 10 and a third polysilicon layer 11 used to form a control gate are deposited in order over the whole surface of the resulting structure.

In the above-mentioned art, the length of the floating gate is extended on the field oxide to increase the surface area of the floating gate. In addition, in order to minimize an increase in memory cell size due to the lengthened floating gate, the space between floating gates is minimized by a hard mask process. Thus, as shown in FIG. 1g, the area of the floating gate increases by 2(L+h) per cell compared to that of the tunneling oxide.

However, the related art flash memory fabricating methods are very complicated and have difficulty in obtaining a desired capacitance in addition to a high degree of integration. In addition, in three-dimensionally formed floating gates, an increase in the surface area between the floating gate and the substrate detrimentally affects program and erase operations. Therefore, the area between the floating gate and the control gate should be large while the area between the floating gate and the substrate is maintained constant.

In addition, in the related art, because the capacitance which affects the CR is determined by just the area of the floating gate and the side area of the floating gate along the word line, the coupling ratio is at most about 0.6. As a result, the voltage delivery efficiency from the control gate to the floating gate is poor, thereby requiring complicated source and drain structure and additional charge pumps to boost the voltage applied to the control gate.

SUMMARY OF INVENTION

The present invention advantageously minimizes unnecessary voltage applied to a control gate by enlarging a contact area between the control gate and the floating gate for an increase of the coupling ratio.

To achieve these objects and other advantages and in accordance with the purpose of the invention, as embodied and broadly described herein, the present invention provides a method for fabricating a flash memory device including forming a STI region on a silicon substrate to define an active region, forming a tunneling oxide layer on the active region, depositing an amorphous silicon layer on the silicon substrate, patterning the amorphous silicon layer along a bit line direction, forming an embossed silicon layer comprising HSGs on the patterned amorphous silicon layer, sequentially depositing an ONO layer and a polysilicon layer for a control gate on the resulting structure, forming a photoresist pattern on the polysilicon layer, and forming a control gate by etching the polysilicon layer using the photoresist pattern as a mask, and simultaneously forming a floating gate along the bit line.

In addition, the objects are achieved by a flash memory device including a tunneling oxide layer on an active region in a silicon substrate, a floating gate comprising amorphous silicon patterned along a word line and a bit line on the tunneling oxide, an embossed silicon layer comprising HSGs on the patterned amorphous silicon layer, an ONO layer on the embossed silicon layer, and a control gate comprising polysilicon on the ONO layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3a through 7b are cross-sectional views along the line A-A' (i.e., word line direction) and the line B-B' (i.e., bit line direction) in FIG. 2.

DETAILED DESCRIPTION OF THE PREFERRED EMBODIMENT

Figure 2:
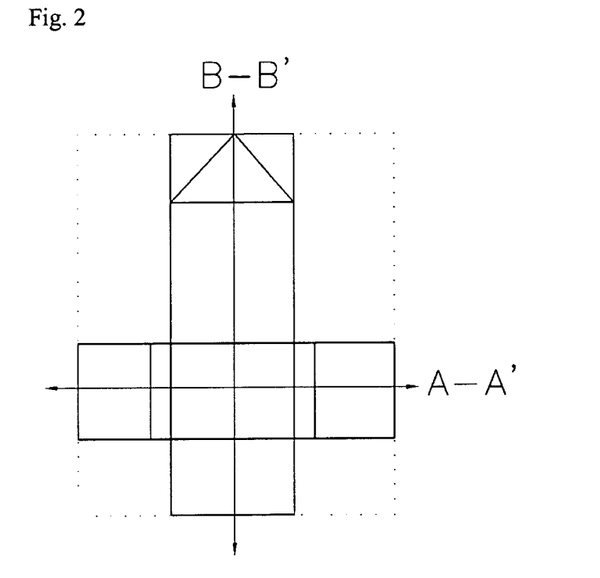
FIG. 2 is a unit cell of a flash memory of one embodiment in accordance with the present invention.

FIG. 2 is a unit cell of a flash memory of one embodiment in accordance with the present invention.

FIGS. 3a through 7b are cross-sectional views along the line A-A' (i.e., word line direction) and the line B-B' (i.e., bit line direction) in FIG. 2. The index 'a' of the figure numbers in FIGS. 3a, 4a, 5a, 6a, and 7a indicates a cross-sectional view along A-A' (i.e., word line direction). The index 'b' of the figure numbers in FIGS. 3b, 4b, 5b, 6b, and 7b indicates a cross-sectional view along the line B-B (i.e., bit line direction).

Figure 3A:
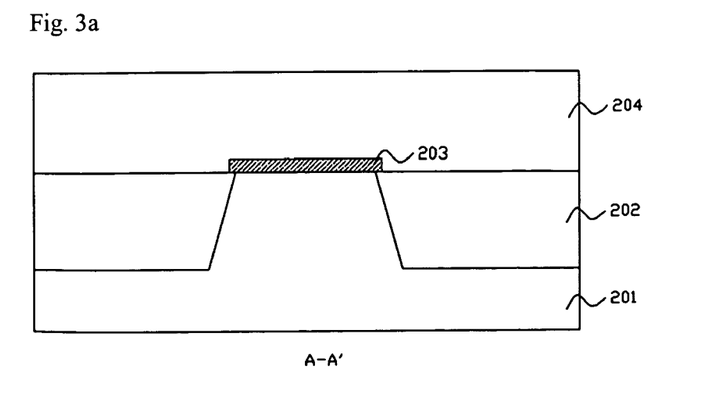
Figure 3B:
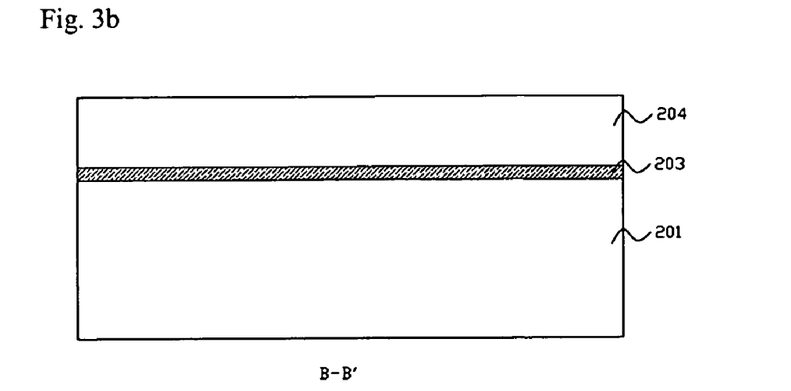

Referring to FIGS. 3a and 3b, STI structures 202 are formed on a silicon substrate 201 to define an active region. A tunneling oxide layer 203 is then grown on the active region. Amorphous polysilicon layer 204 used to form a floating gate is then deposited on the entire area of the resulting structure.

Figure 4A:
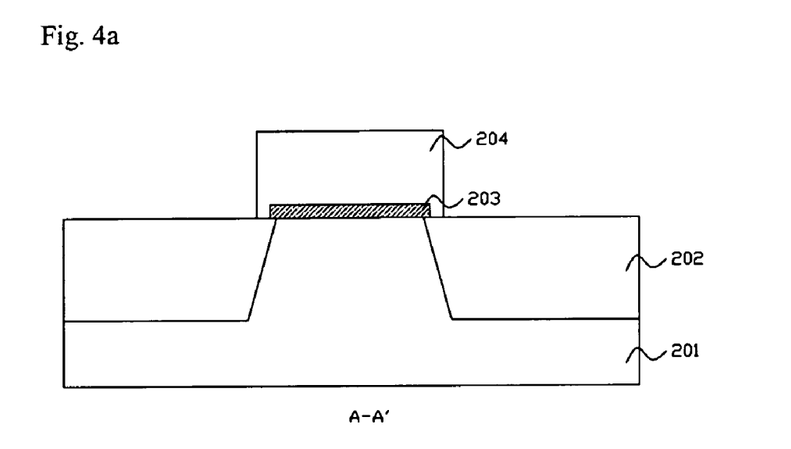
Figure 4B:
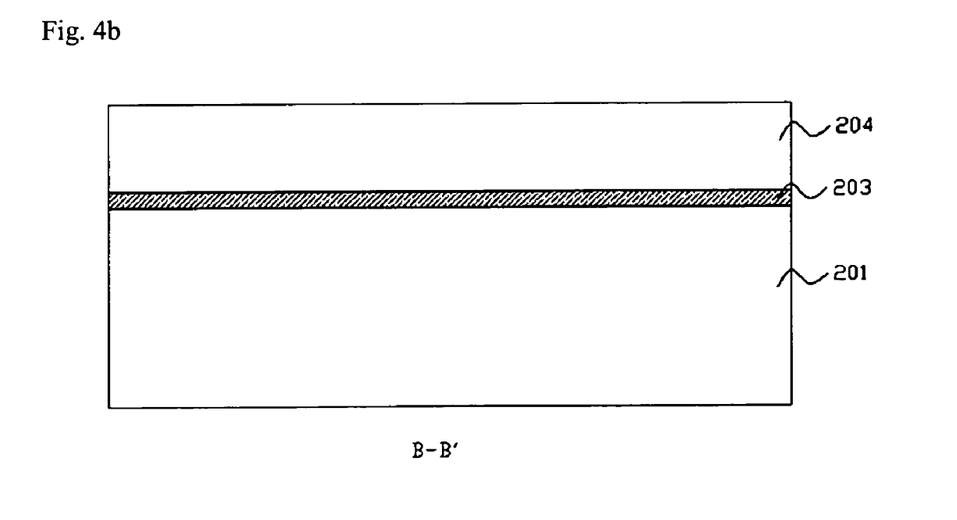

Referring to FIGS. 4a and 4b, the amorphous silicon layer 204 is patterned along the bit line direction. A photoresist is deposited on top of the amorphous silicon layer 204. After the photoresist is patterned along the bit line direction through a photolithography process, the amorphous silicon 204 is etched using the patterned photoresist as a mask. The mask is then removed.

Figure 5A:
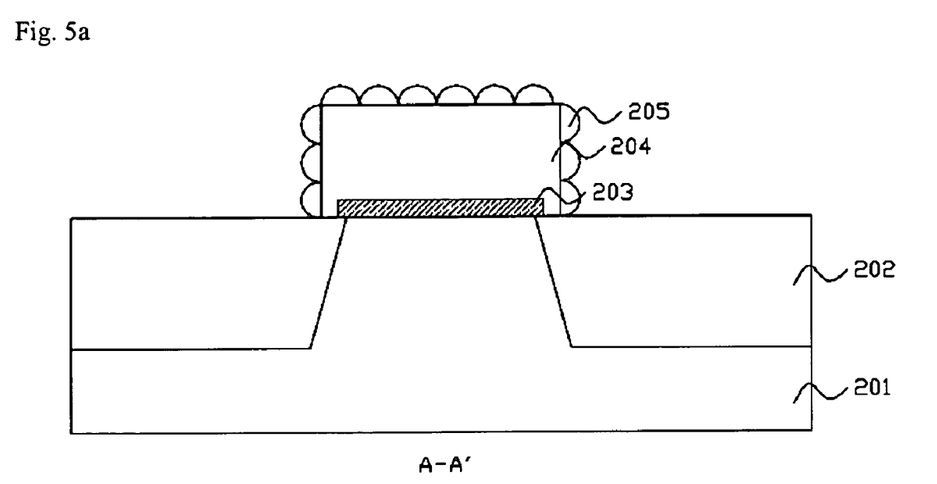
Figure 5B:
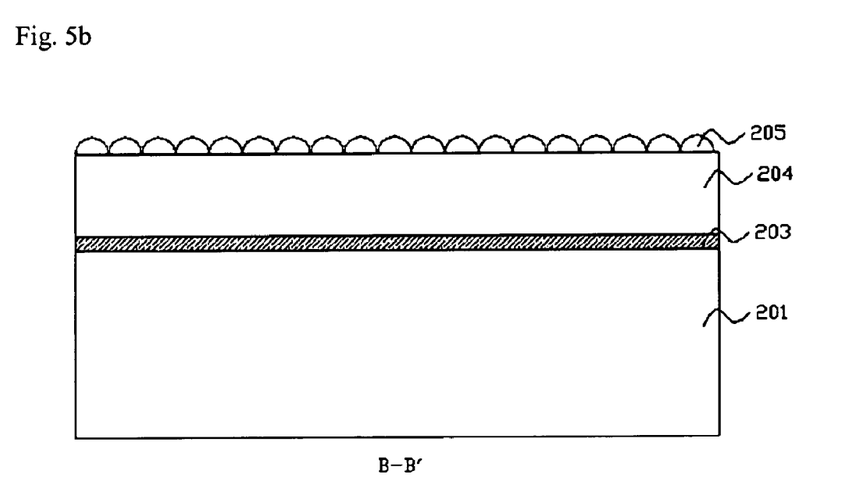

Referring to FIGS. 5a and 5b, an embossed silicon layer 205 is formed on the amorphous silicon layer 204 through an HSG (Hemisphere Silicon Glass) process. Here, the HSGs are formed both on the top and the lateral faces of the amorphous silicon layer 204 along the bit line, thereby maximizing a coupling ratio.

Figure 6A:
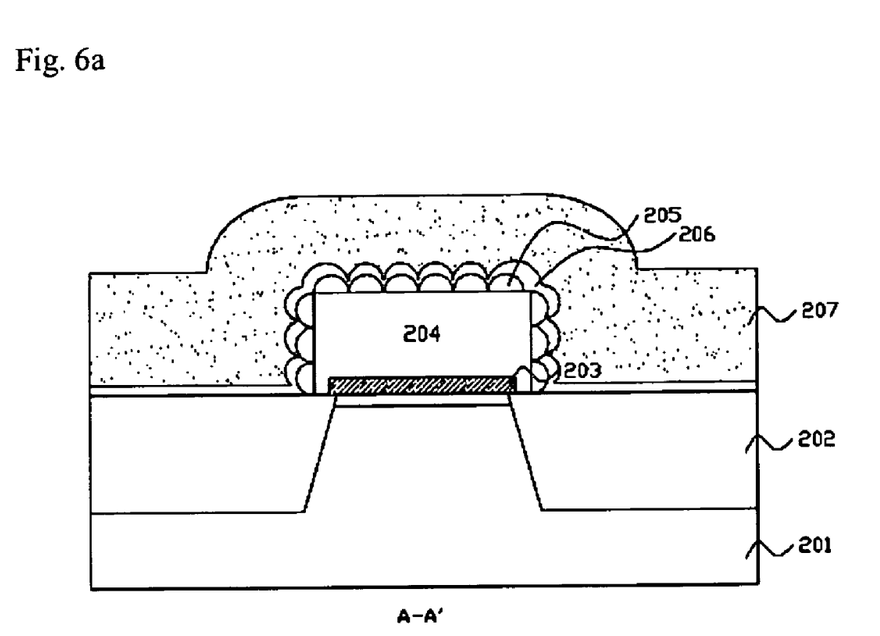
Figure 6B:
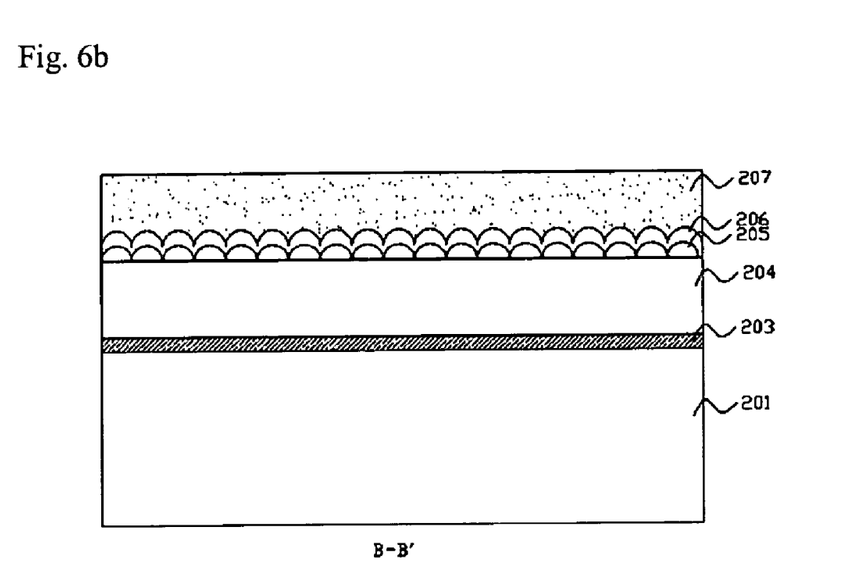

Referring to FIGS. 6a and 6b, an ONO layer 206 and a polysilicon layer 207 used to form a control gate are then deposited on the entire surface of the resulting structure.

Figure 7A:
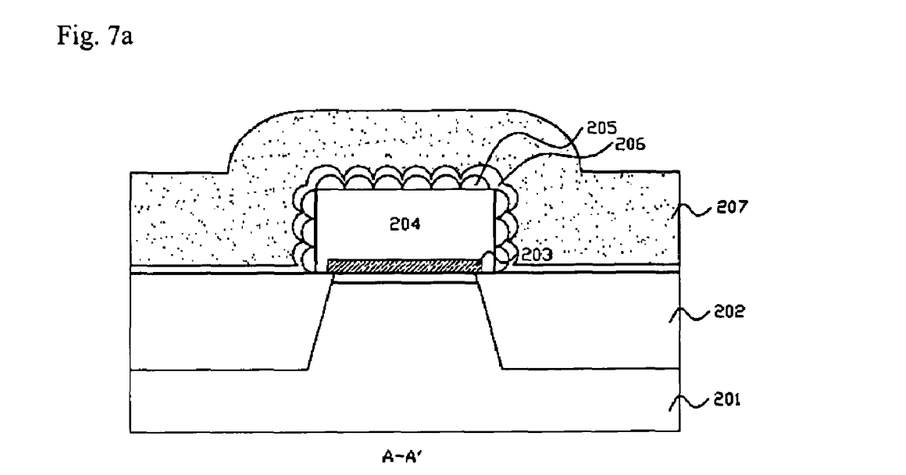
Figure 7B:
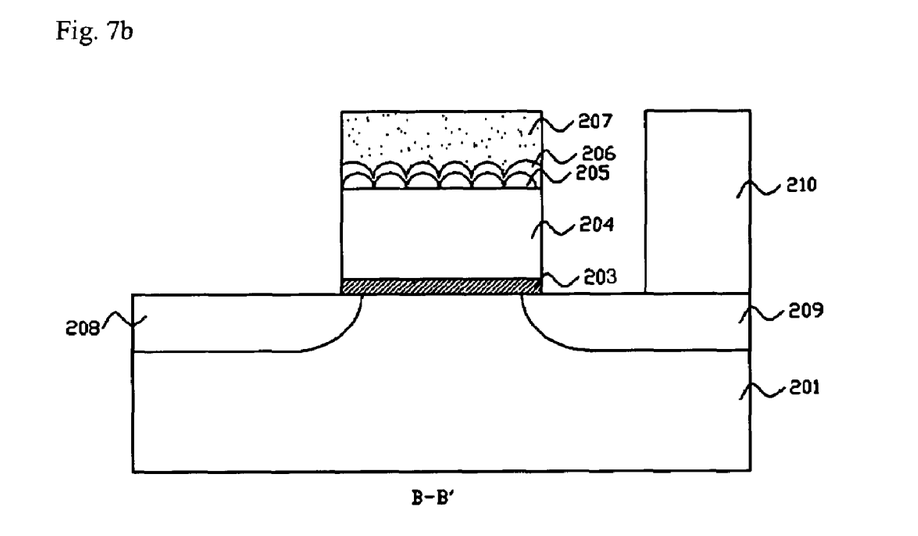

Referring to FIGS. 7a and 7b, a photoresist is deposited on the resulting structure and is then patterned through a photolithography processes. Subsequently, a control gate is then formed by etching the polysilicon layer using the patterned photoresist as a mask. While the control gate is being formed, the floating gate is simultaneously formed along the word line direction. The mask is then removed. Common source and drain regions 208 and 209 and a bit line contact 210 are then formed through a later process.

Accordingly, the present invention provides a method for increasing the coupling ratio by using HSG and, more particularly, by forming the embossed silicon layer comprising the HSG on the amorphous silicon layer to form the floating gate. Therefore, a voltage applied to the control gate is efficiently diminished, the number of charge pump circuits decreases and, moreover, the size and the structure of the source and drain regions in the charge pump circuit are reduced and simplified.

Korean Patent Application Serial Number 10-2003-0101069, filed on Dec. 31, 2003, is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a flash memory device comprising the steps of:
    forming a shallow trench isolation region on a silicon substrate to define an active region;
    forming a tunneling oxide layer on the active region;
    depositing an amorphous silicon layer on the silicon substrate;
    patterning the amorphous silicon layer along a bit line direction;
    forming an embossed silicon layer comprising hemisphere silicon glass on the amorphous silicon layer to enlarge a contact layer;
    depositing an oxide-nitride-oxide layer on the embossed silicon layer, thereby forming a resulting structure;
    depositing a polysilicon layer to form a control gate on the resulting structure;
    forming a photoresist pattern on the polysilicon layer; and
    forming a control gate by etching the polysilicon layer using the photoresist pattern as a mask, and simultaneously forming a floating gate along a word line direction.

2. The method as defined by claim 1, wherein the step of forming the embossed silicon layer includes forming the embossed silicon layer on a top and sidewalls of the amorphous silicon layer.

3. A method for fabricating a flash memory device comprising:
    a step for forming a shallow trench isolation region on a silicon substrate to define an active region;
    a step for forming a tunneling oxide layer on the active region; a step for depositing an amorphous silicon layer on the silicon substrate; a step for patterning the amorphous silicon layer along a bit line direction;
    a step for forming an embossed silicon layer comprising hemisphere silicon glass on the amorphous silicon layer to enlarge a contact layer;
    a step for depositing an oxide-nitride-oxide layer on the embossed silicon layer, thereby forming a resulting structure;

a step for depositing a polysilicon layer to form a control gate on the resulting structure;

a step for forming a photoresist pattern on the polysilicon layer;

a step for forming a control gate by etching the polysilicon layer using the photoresist pattern as a mask, and simultaneously forming a floating gate along a word line direction; and a step of forming common source and drain regions and a bit line contact.

4. The method as defined by claim 3, wherein the step for forming an the embossed silicon layer includes a step for forming the embossed silicon layer on a top and sidewalls of the amorphous silicon layer.

* * * * *